United States Patent
Yazdi et al.

(10) Patent No.: US 10,382,060 B2
(45) Date of Patent: Aug. 13, 2019

(54) ON-LINE SELF-CHECKING HAMMING ENCODER, DECODER AND ASSOCIATED METHOD

(71) Applicant: TAIWAN SEMICONDUCTOR MANUFACTURING COMPANY LTD., Hsinchu (TW)

(72) Inventors: Ramin Yazdi, Ontario (CA); Saman M. I. Adham, Ontario (CA); Arshak Arshakyan, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/229,591

(22) Filed: Aug. 5, 2016

(65) Prior Publication Data
US 2018/0041229 A1 Feb. 8, 2018

(51) Int. Cl.
*H03M 13/15* (2006.01)
*H03M 13/00* (2006.01)
*G06F 11/00* (2006.01)
*H03M 13/19* (2006.01)

(52) U.S. Cl.
CPC .................................. *H03M 13/19* (2013.01)

(58) Field of Classification Search
None
See application file for complete search history.

(56) References Cited

U.S. PATENT DOCUMENTS

| | | | | | |
|---|---|---|---|---|---|
| 6,092,217 | A | * | 7/2000 | Kanekawa | G05B 9/03 714/11 |
| 6,128,528 | A | * | 10/2000 | Ericksen | A61N 1/37 607/2 |
| 7,020,811 | B2 | * | 3/2006 | Byrd | H04L 1/004 714/52 |
| 2002/0157044 | A1 | * | 10/2002 | Byrd | H04L 1/004 714/703 |

OTHER PUBLICATIONS

Self-checking circuits and decoding algorithms for binary hamming and BCH codes and Reed-Solomon codes over GF(2 m) Problems of Information Transmission, 2008, vol. 44, No. 2, p. 99 I. M. Boyarinov.*

* cited by examiner

*Primary Examiner* — Justin R Knapp
(74) *Attorney, Agent, or Firm* — Hauptman Ham, LLP

(57) ABSTRACT

An on-line self-checking Hamming encoder is disclosed. The on-line self-checking Hamming encoder includes: a Hamming encoder, used to convert a received data vector into a Hamming codeword; and an error check unit, coupled to the Hamming encoder and used to generate a syndrome data vector of the Hamming codeword; wherein the on-line self-checking Hamming encoder generates an on-line self-checking result according to the syndrome. An on-line self-checking Hamming decoder and an associated method are also disclosed.

18 Claims, 3 Drawing Sheets

ON-LINE SELF-CHECKING HAMMING ENCODER, DECODER AND ASSOCIATED METHOD

BACKGROUND

During the process of transmitting binary data or transforming binary data from one medium to another, bits may be lost. Bit loss, for example, would be likely to occur due to some permanent, transient or intermittent faults. Various means for detecting errors have been used. Hamming codes have the advantage of being able to detect two errors in a data field, and also to correct a one-bit error. When Hamming codes are used in conjunction with other codes (parity checks, check sums, etc.) the detection of any number of error bits, or the corrosion of one error bit per record is obtainable. However, a fault that occurs inside a Hamming encoder/decoder circuit may lead to erroneous detection results of the Hamming decoder. In other words, the fault occurs in the Hamming encoder/decoder circuit itself is generally undetectable by the Hamming decoder.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of the discussion.

DETAILED DESCRIPTION

Figure 1:
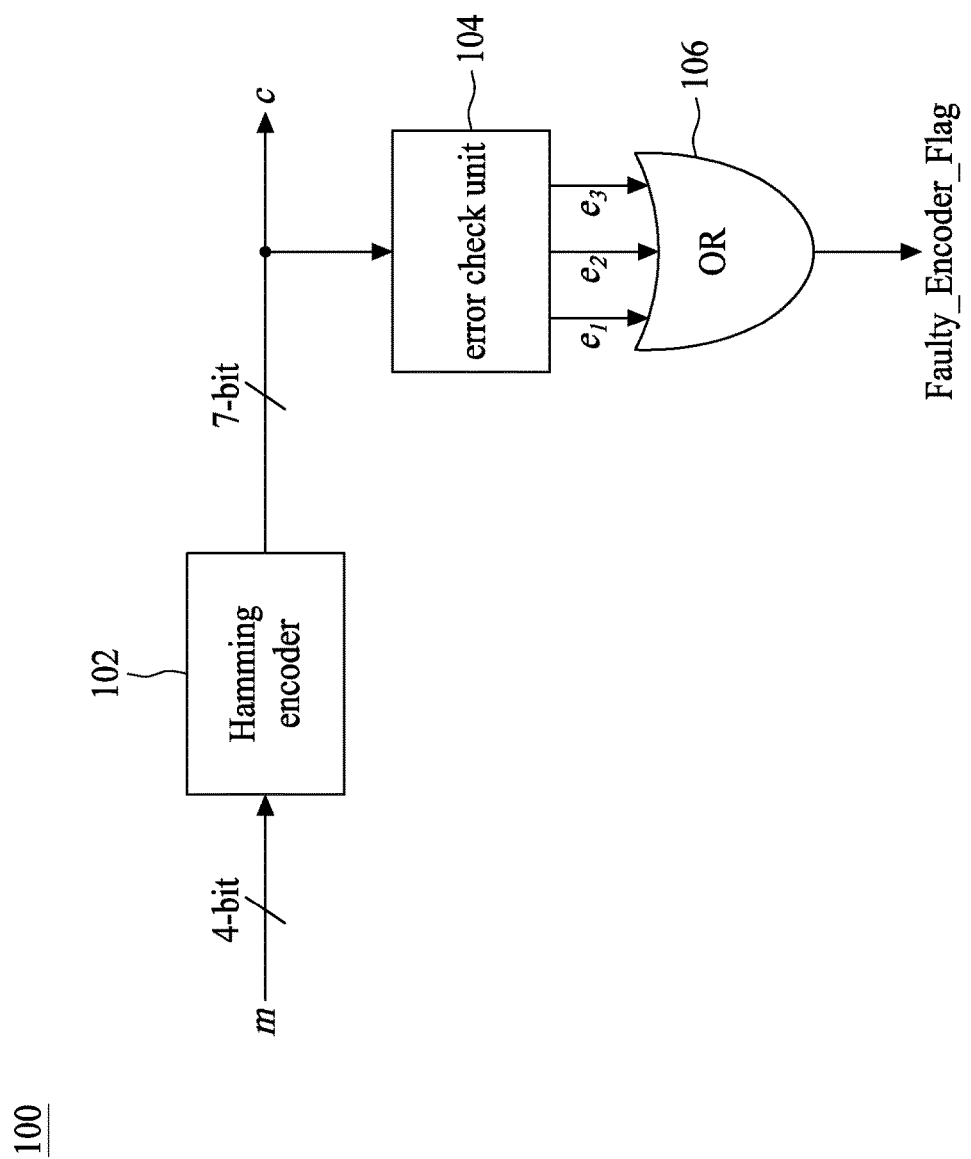
FIG. 1 is a diagram illustrating an on-line self-checking Hamming encoder in accordance with an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In telecommunication, Hamming codes are a family of linear error-correcting codes that generalize the (7, 4) Hamming code. Hamming codes have the advantage of being able to detect up to two-bit errors or correct one-bit errors, known as single-error correcting (SEC) and double-error detecting (DED). When Hamming codes are used in conjunction with other codes (parity checks, check sums, etc.) the detection of any number of error bits, or the corrosion of one error bit per record is obtainable. Additional circuitry is needed to implement a function of Hamming codes on an integrated circuit. For example, most data storage apparatuses and communication apparatuses incorporate an error correcting function of detecting data errors and correcting these errors. The error correcting function is implemented by the encoding/decoding system using Hamming codes in which one bit of data can be corrected. The encoding/decoding system performs an encoding process, in which a data bit string (data vector) and a generator matrix is used to generate Hamming codes. Further, the encoding/decoding system performs a decoding process, in which Hamming codes and a check matrix or a parity check matrix, both associated with the generator matrix, are utilized to detect error positions.

The data bit string may correspond to the input data stored in a recording medium (i.e., disk or memory provided in a data storage apparatus). Also, the data bit string may correspond to the transmission data in a communication apparatus. The Hamming code is constituted by a data bit string and a parity bit string (parity data). In the decoding process, the error positions (error addresses) are detected in the output data (i.e., received data in a communication apparatus) constituted by Hamming codes, and error data called "syndrome," which represents the error positions, is generated. An error correcting process is performed, correcting the error bits at the error positions detected in the decoding process. Data that is free of error bits can therefore be output.

However, like other systems of error correction function, the Hamming encoding/decoding system can only detect and correct errors generated outside the Hamming encoding/decoding system. When there is an error due to a hardware fault inside the Hamming encoding/decoding system, it will be unable to identify such an error by using the existing Hamming encoding/decoding system. The concept of the present disclosure is to provide a novel on-line fault detection for Hamming encoding/decoding systems that is able to identify and report faults induced inside the Hamming encoding/decoding system. The faults can be an intermittent fault, a transient fault or a permanent fault.

FIG. 1 is a diagram illustrating an on-line self-checking Hamming encoder 100 in accordance with an exemplary embodiment of the present disclosure. In this exemplary embodiment, a (7, 4) Hamming code is implemented. However, this is not a limitation of the present disclosure. The ordinarily skilled artisan readily understands that any extended Hamming codes may be utilized in implementing the disclosure. When using extended Hamming codes other than the exemplary (7, 4) Hamming code, the on-line self-checking Hamming encoder 100 may require corresponding modification based on the exemplary embodiment of FIG. 1.

The on-line self-checking Hamming encoder 100 includes a Hamming encoder 102, an error check unit 104 and an OR ( ) unit 106. The Hamming encoder 102 is a (7, 4) Hamming encoder that converts a data sequence corresponding to input information bits m on a transmission side among received data into an encoded codeword. In the exemplary embodiment, input information bits m is a 4-tuple vector comprised of 4 bits, $m_1$, $m_2$, $m_3$, and $m_4$, i.e. $m=(m_1, m_2, m_3, m_4)$. Encoded codeword c is a 7-tuple vector comprised of 7 bits $c_1$, $c_2$, $c_3$, $c_4$, $c_5$, $c_6$ and $c_7$, i.e. $c=(c_1, c_2, c_3, c_4, c_5, c_6, c_7)$. The encoded codeword c is composed of the input information bits m and parity bits p. The parity bits p is a 3-tuple vector comprised of 3 bits, $p_1$, $p_2$, and $p_3$, i.e. $p=(p_1, p_2, p_3)$.

The Hamming encoder 102 may perform matrix multiplication on the input information bits m and a predefined generator matrix determined according to the type of the employed Hamming code. The output of the Hamming encoder 102 is a codeword c. In the exemplary embodiment, the predefined generator matrix may be determined based on the (7, 4) Hamming code. For example, the predefined generator matrix may be the 4×7 generator matrix G of the (7, 4) Hamming code. In some embodiments, the predefined generator matrix may be a 4×7 generator matrix $G_{syst}$ of the (7, 4) Hamming code in a systematic form. In this case, the generator matrix $G_{syst}$ makes the first 4 bits of each codeword c copy input information bits m without any transformation.

The error check unit 104 is coupled to the Hamming encoder 102. In the exemplary embodiment, the error check unit 104 may be used to compute a syndrome of the codeword c. In particular, the error check unit 104 may perform matrix multiplication on a predefined parity-check matrix and the codeword c. The predefined parity-check matrix may be determined according to the type of the employed Hamming code. In the exemplary embodiment, the predefined parity-check matrix is determined based on the (7, 4) Hamming code. For example in case of the (7,4) Hamming code, the parity check matrix H is a 3×7 matrix. Accordingly, the error check unit 104 outputs a 3-tuple vector e comprised of 3 bits, $e_1$, $e_2$ and $e_3$, i.e. $e=(e_1, e_2, e_3)$.

When there is a fault in the Hamming encoder 102, the encoded codeword c is highly likely to be a non-valid codeword. The error check unit 104 employed here is for checking whether the encoded codeword c is a valid codeword based on the principle of the (7, 4) Hamming code. When the 3-tuple vector $(e_1, e_2, e_3)$ produced by the error check unit 104 does not equal to (0, 0, 0), the encoded codeword c is determined to be a non-valid codeword. In this case, there may be at least one fault in the Hamming encoder 102 and/or the error check unit 104. On the other hand, when the 3-tuple vector $(e_1, e_2, e_3)$ produced by the error check unit 104 equals to (0, 0, 0), the encoded codeword c is determined to be a valid codeword. In this case, there may be no fault in the Hamming encoder 102 and the error check unit 104. However, another possibility in this case is that there may be at least one fault in the Hamming encoder 102 and/or the error check unit 104 causing more than two error bits in the codeword c. This kind of fault cannot be detected in the embodiment.

In the exemplary embodiment, the OR unit 106 is a 3-input OR logic gate coupled to the error check unit 104. The 3-tuple vector $(e_1, e_2, e_3)$ produced by the error check unit 104 is fed into the OR unit 106. When the 3-tuple vector $(e_1, e_2, e_3)$ equals to (0, 0, 0), an output Faulty_Encoder_Flag of the OR unit 106 will be at a logical "0" level, which indicates the codeword c is a valid codeword. When the 3-tuple vector $(e_1, e_2, e_3)$ does not equal to (0, 0, 0), the output Faulty_Encoder_Flag of the OR unit 106 will be at a logical "1" level, which indicates the codeword c is not a valid codeword.

Comparing the on-line self-checking Hamming encoder 100 with some existing structures like a fully redundant Hamming encoder that also attempts to improve the self-checking ability of a Hamming encoder, the on-line self-checking Hamming encoder 100 is easier to implement, and yields lower gate count than the fully redundant Hamming encoder. Thereby the complexity and cost of the on-line self-checking Hamming encoder 100 can be kept relatively low.

Figure 2:
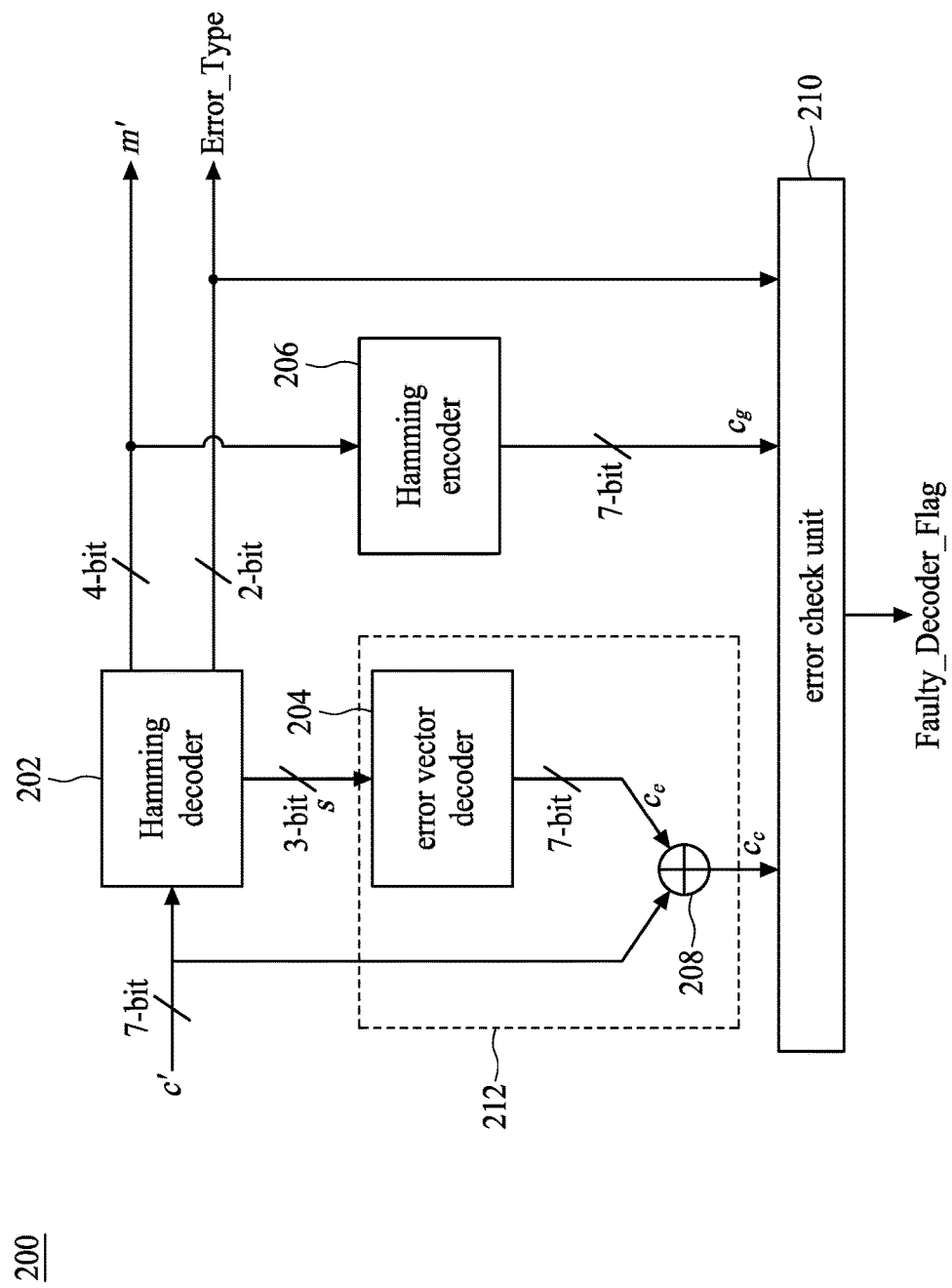
FIG. 2 is a diagram illustrating an on-line self-checking Hamming decoder in accordance with an exemplary embodiment of the present disclosure.

FIG. 2 is a diagram illustrating an on-line self-checking Hamming decoder 200 in accordance with an exemplary embodiment of the present disclosure. In this exemplary embodiment, a (7, 4) Hamming code is implemented. However, this is not a limitation of the present disclosure. The ordinarily skilled artisan readily understands that any extended Hamming codes may be utilized in implementing the disclosure. When using extended Hamming codes other than the exemplary (7, 4) Hamming code, the on-line self-checking Hamming decoder 200 may require corresponding modification based on the exemplary embodiment of FIG. 2.

The on-line self-checking Hamming decoder 200 includes a Hamming decoder 202, a correction unit 212, a Hamming encoder 206 and an error check unit 210.

The Hamming decoder 202 is a (7, 4) Hamming decoder that converts a codeword received from a (7, 4) Hamming encoder into a decoded data sequence. The Hamming codeword may be transmitted from the (7, 4) Hamming encoder through a channel having noise and interference on the channel, so that errors may be introduced. In the exemplary embodiment, a received codeword c' is a 7-tuple vector comprised of 7 bits $c_1'$, $c_2'$, $c_3'$, $c_4'$, $c_5'$, $c_6'$ and $c_7'$, i.e. $c'=(c_1', c_2', c_3', c_4', c_5', c_6', c_7')$. A decoded information bits m' is a 4-tuple vector comprised of 4 bits, $m_1'$, $m_2'$, $m_3'$, and $m_4'$, i.e. $m'=(m_1', m_2', m_3', m_4')$.

In the exemplary embodiment, the Hamming decoder 202 produces a binary error vector Error_Type for indicating an error type of the received codeword c'. There are four error types including no error, single error, double error and undefined error. The binary error vector Error_Type may also be hand coded, for example, 2'b00 indicates no error; 2'b01 indicates single error; 2'b10 indicates undefined error; and 2'b11 indicates double error. In the exemplary embodiment, when there is only a single error in the received codeword c', the (7, 4) Hamming decoder 202 is able to correct the error. The Hamming decoder 202 may perform matrix multiplication on a predefined parity-check matrix and the received codeword c' to compute a syndrome s of the received codeword c'. In the exemplary embodiment, a syndrome s is a 3-tuple vector comprised of 3 bits $s_1$, $s_2$ and $s_3$, i.e. s=($s_1$, $s_2$, $s_3$). The Hamming decoder 202 may use the syndrome s to correct the received codeword c' and therefore generate a corrected codeword c", thereby obtaining the decoded information bits m' by simply removing parity bits located at predefined positions of the corrected codeword c".

The correction unit 212 is coupled to the Hamming decoder 202. The correction unit 212 includes an error vector decoder 204 and an adder 208. The correction unit 212 is used to generate a corrected codeword $c_c$ based on the received codeword c' and the syndrome s for a single error condition. The error vector decoder 204 is used to generate a 7-bit error position vector $c_e$ for a single error condition according to the syndrome s. The adder 208 is used to add the received codeword c' and the error position vector $c_e$ to obtain a corrected codeword $c_c$. The Hamming encoder 206 is coupled to the Hamming decoder 202. The Hamming encoder 206 basically performs the same or similar function as the Hamming encoder 102 described and illustrated with reference to FIG. 1. The Hamming encoder 206 may perform matrix multiplication on the decoded information bits m' and a predefined generator matrix determined according to the type of the employed Hamming code. The output of the Hamming encoder 206 is a generated reference codeword $c_g$.

The error check unit 210 of the on-line self-checking Hamming decoder 200 is used to produce an output Faulty_Decoder_Flag according to the corrected codeword $c_c$, the generated reference codeword $c_g$ and the error vector Error_Type. For example, a logical "0" level of the output Faulty_Decoder_Flag indicates there is no logic fault detected or no decision made by the on-line self-checking Hamming decoder 200; and a logical "1" level of the output Faulty_Decoder_Flag indicates there is a logic fault detected by the on-line self-checking Hamming decoder 200. Details regarding functions and operations of the error check unit 210 are described in conjunction with FIG. 3.

Figure 3:
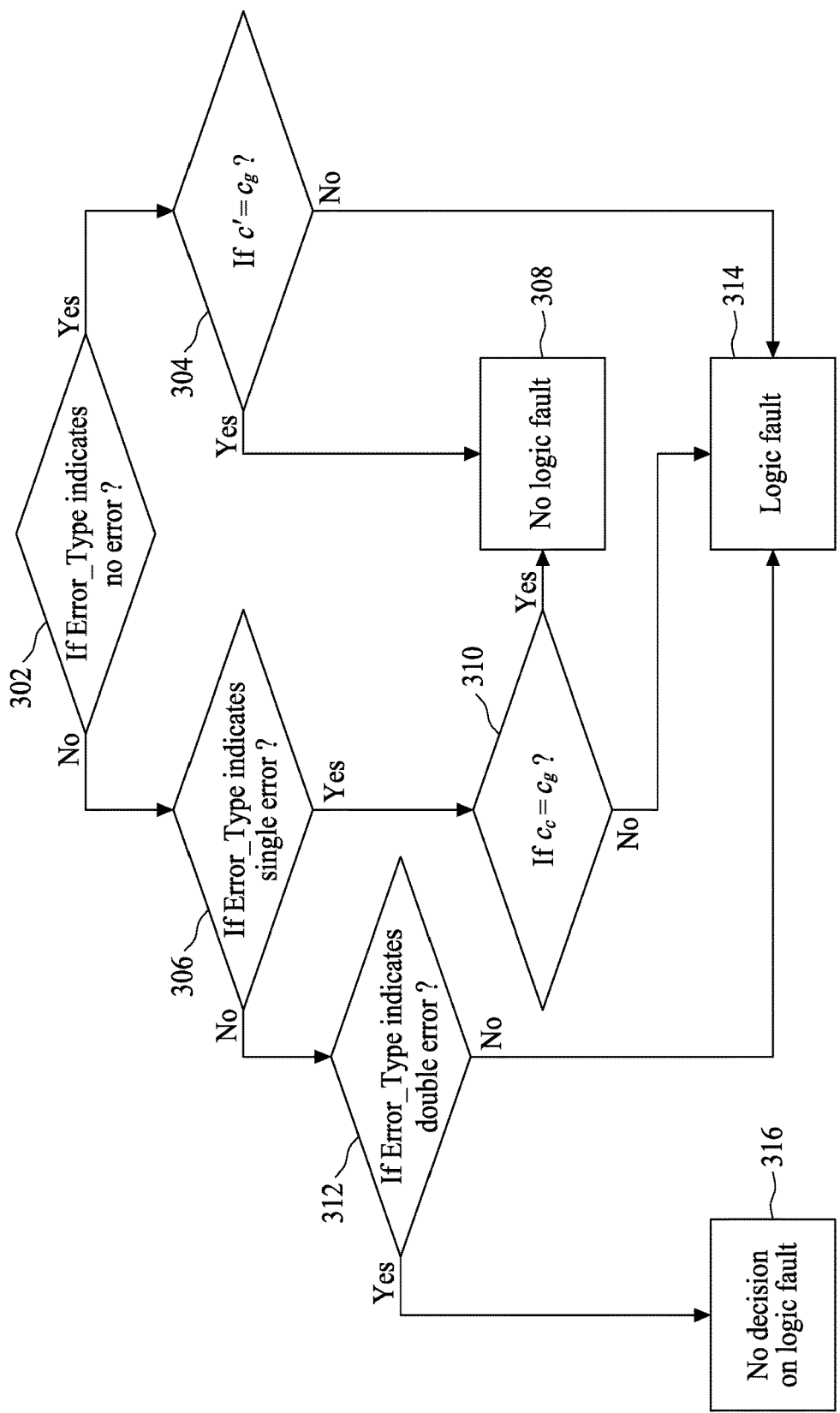
FIG. 3 is a flow chart illustrating an error check method of the error check unit in accordance with an exemplary embodiment of the present disclosure.

FIG. 3 is a flow chart illustrating an error check method of the error check unit 210 in accordance with an exemplary embodiment of the present disclosure. First, the error check unit 210 checks if Error_Type indicates a "no error" condition at operation 302. If affirmative, the error check unit 210 will further check if the received codeword c' equals the generated reference codeword $c_g$ at operation 304. If affirmative, the flow will enter operation 308 and set the output Faulty_Decoder_Flag to logical "0" level to indicate there is no logic fault. If the received codeword c' does not equal the generated reference codeword $c_g$, the flow will enter operation 314 and set the output Faulty_Decoder_Flag to logical "1" level to indicate there is a logic fault.

Returning back to operation 302, if Error_Type does not indicate a "no error" condition, the flow will enter operation 306 to check if Error_Type indicates a "single error" condition. If affirmative, the error check unit 210 will further check if the corrected codeword $c_c$ equals the generated reference codeword $c_g$ at operation 310. If affirmative, the flow will enter operation 308 and set the output Faulty_Decoder_Flag to logical "0" level to indicate there is no logic fault. If the corrected codeword $c_c$ does not equal the generated reference codeword $c_g$, the flow will enter operation 314 and set the output Faulty_Decoder_Flag to logical "1" level to indicate there is a logic fault.

Returning back to operation 306, if Error_Type does not indicate a "single error" condition, the flow will enter operation 312 to check if Error_Type indicates a "double error" condition. If affirmative, the error check unit 210 will enter operation 316 and set the output Faulty_Decoder_Flag to logical "0" level to indicate there is no decision made by the error check unit 210. If the Error_Type does not indicate a "double error" condition, the flow will enter operation 314 and set the output Faulty_Decoder_Flag to logical "1" level to indicate there is a logic fault.

Some embodiments of the present disclosure provide an on-line self-checking Hamming encoder, including: a Hamming encoder, used to convert a received data vector into a Hamming codeword; and an error check unit, coupled to the Hamming encoder and used to generate a syndrome data vector of the Hamming codeword; wherein the on-line self-checking Hamming encoder generates an on-line self-checking result according to the syndrome.

Some embodiments of the present disclosure provide a n on-line self-checking Hamming decoder, including: a Hamming decoder, used to generate a data vector, a syndrome data vector and an error type according to the received Hamming codeword; a correction unit, coupled to the Hamming decoder and used to generate a corrected Hamming codeword based on the received Hamming codeword and the syndrome data vector; a Hamming encoder, coupled to the Hamming decoder and used to convert the data vector into a reference Hamming codeword; and an error check unit, coupled to the Hamming decoder, the correction unit and the Hamming encoder; wherein the error check unit generates an on-line self-checking result according to the corrected Hamming codeword, the reference Hamming codeword and the error type.

Some embodiments of the present disclosure provide a n on-line self-checking method for a Hamming decoder, including: generating a data vector, a syndrome data vector and an error type according to the received Hamming codeword, wherein the error type indicate a number of errors in the received Hamming codeword; generating a corrected Hamming codeword based on the received Hamming codeword and the syndrome data vector; converting the data vector into a reference Hamming codeword; and generating an on-line self-checking result according to the corrected Hamming codeword, the reference Hamming codeword and the error type.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit, comprising:
a Hamming encoder system, including:
a Hamming encoder configured to generate a Hamming codeword responsive to a received data vector;
an error check device coupled to the Hamming encoder, and configured to generate a syndrome data vector of the Hamming codeword by performing a matrix multiplication of a predefined parity-check matrix and the Hamming codeword; and
an OR logic device coupled to the error check device, the OR logic device is configured to perform an OR operation on the syndrome data vector to yield an on-line self-checking result;
wherein the on-line self-checking result indicates whether a hardware fault occurs in the Hamming encoder, the hardware fault causing an error in the Hamming codeword.

2. The integrated circuit of claim 1, wherein the Hamming encoder performs a matrix multiplication on the received data vector and a predefined generator matrix to generate the Hamming codeword.

3. The integrated circuit of claim 1, wherein the Hamming encoder is a (7, 4) Hamming encoder.

4. The integrated circuit of claim 3, wherein the OR logic device is a 3-input OR logic gate comprising:
a first input terminal coupled to the error check device;
a second input terminal coupled to the error check device;
a third input terminal coupled to the error check device; and
a first output terminal configured to output the on-line self-checking result,
wherein the OR logic device is configured to check an integrity of the Hamming codeword.

5. The integrated circuit of claim 1, wherein
the on-line self-checking result is a logical zero, when the Hamming codeword has no errors; and
the on-line self-checking result is a logical one, when the Hamming codeword has the error.

6. An integrated circuit comprising:
a Hamming decoder system, including:
a Hamming decoder configured to generate a data vector, a syndrome data vector and an error type according to a received Hamming codeword;
a correction device coupled to at least the Hamming decoder, and configured to generate a corrected Hamming codeword based on the received Hamming codeword and the syndrome data vector;
a Hamming encoder, coupled to at least the Hamming decoder, and configured to convert the data vector into a reference Hamming codeword; and
an error check device coupled to each of the Hamming decoder, the correction device and the Hamming encoder;
wherein the error check device generates an on-line self-checking result according to each of the corrected Hamming codeword, the reference Hamming codeword and the error type to indicate whether a hardware fault occurs in the Hamming decoder, the hardware fault causing an error in at least the data vector.

7. The integrated circuit of claim 6, wherein the Hamming decoder performs a matrix multiplication on a predefined parity-check matrix and the received Hamming codeword to generate the syndrome data vector of the received Hamming codeword.

8. The integrated circuit of claim 6, wherein the error type is used to indicate a number of errors in the received Hamming codeword.

9. The integrated circuit of claim 6, wherein the correction device comprises:
an error vector decoder coupled to at least the hamming decoder, and configured to generate an error position vector according to the syndrome data vector.

10. The integrated circuit of claim 9, wherein the correction device is configured to generate the corrected Hamming codeword according to the received Hamming codeword and the error position vector.

11. The integrated circuit of claim 9, wherein the correction device further comprises:
an adder coupled to the error vector decoder and the error check device, the adder being configured to generate the corrected Hamming codeword according to the received Hamming codeword and the error position vector.

12. The integrated circuit of claim 6, wherein the Hamming encoder performs a matrix multiplication on the data vector and a predefined generator matrix to generate the reference Hamming codeword.

13. The integrated circuit of claim 6, wherein the Hamming decoder is a (7, 4) Hamming decoder.

14. An integrated circuit comprising:
a Hamming decoder system comprising:
a Hamming decoder configured to generate a data vector, a first syndrome data vector, and an error type according to a received Hamming codeword, the Hamming decoder having a first set of input terminals, a first set of output terminals, a second set of output terminals and a third set of output terminals, the first set of output terminals configured to output the data vector, the second set of output terminals configured to output the first syndrome data vector, and the third set of output terminals configured to output the error type;
an error vector decoder having a second set of input terminals and a fourth set of output terminals, the second set of input terminals being coupled to the first set of output terminals of the Hamming decoder, and the fourth set of output terminals being configured to output an error position vector according to the first syndrome data vector;
an adder having a third set of input terminals, a fourth set of input terminals and a fifth set of output terminals, the fourth set of input terminals being coupled to the fourth set of output terminals, the third set of input terminals being configured to receive the received Hamming codeword, and the fifth set of output terminals being configured to output a corrected Hamming codeword according to the received Hamming codeword and the error position vector; and an error check device coupled to the second set of output terminals of the Hamming decoder and the fifth set of output terminals of the adder;

wherein the error check device generates a first on-line self-checking result according to at least the corrected Hamming codeword and the error type to indicate whether a first hardware fault occurs inside the Hamming decoder, the first hardware fault causing a first error in at least the data vector generated by the Hamming decoder.

15. The integrated circuit of claim 14, further comprising:
a first Hamming encoder having a fifth set of input terminals and a sixth set of output terminals, the fifth set of input terminals being coupled to the third set of output terminals, the sixth set of output terminals being coupled to the error check device, and the sixth set of output terminals being configured output a reference Hamming codeword based on the data vector.

16. The integrated circuit of claim 15, further comprising:
a Hamming encoder system coupled to the Hamming decoder system, the Hamming encoder system comprising:
  a second Hamming encoder having a sixth set of input terminals and a seventh set of output terminals, the seventh set of output terminals being configured to output the received Hamming codeword responsive to a received data vector;
  an error check device having a seventh set of input terminals and an eighth set of output terminals, the seventh set of input terminals being coupled to the seventh set of output terminals of the second Hamming encoder, and the eighth set of output terminals configured to output a second syndrome data vector of the received Hamming codeword by performing a matrix multiplication of a predefined parity-check matrix and the received Hamming codeword; and
  an OR logic device having an eighth set of input terminals and a first output terminal, the eighth set of input terminals being coupled to the eight set of output terminals, the OR logic device being configured to perform an OR operation on the second syndrome data vector to yield a second on-line self-checking result;
  wherein the second on-line self-checking result indicates whether a second hardware fault occurs inside the second Hamming encoder, the second hardware fault causing a second error in the received Hamming codeword generated by the second Hamming encoder or the second syndrome data vector generated by the error check device.

17. The integrated circuit of claim 16, wherein the OR logic device is a 3-input OR logic gate comprising:
  a first input terminal of the eighth set of input terminals coupled to the error check device;
  a second input terminal of the eighth set of input terminals coupled to the error check device;
  a third input terminal of the eighth set of input terminals coupled to the error check device; and
  the first output terminal being configured to output the second on-line self-checking result,
  wherein the OR logic device is configured to check an integrity of the received Hamming codeword.

18. The integrated circuit of claim 17, wherein
the first error is detected without using a redundant Hamming decoder, or
the second error is detected without using a redundant Hamming encoder.

* * * * *